(12) United States Patent
Wang et al.

(10) Patent No.: US 7,906,810 B2
(45) Date of Patent: Mar. 15, 2011

(54) LDMOS DEVICE FOR ESD PROTECTION CIRCUIT

(75) Inventors: Chang-Tzu Wang, Taipei (TW); Tien-Hao Tang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 302 days.

(21) Appl. No.: 12/186,716

(22) Filed: Aug. 6, 2008

(65) Prior Publication Data
US 2010/0032758 A1 Feb. 11, 2010

(51) Int. Cl.
*H01L 23/02* (2006.01)
(52) U.S. Cl. ........ 257/335; 257/341; 257/346; 257/401; 257/409; 257/E21.427; 257/E29.062; 257/E29.064; 257/E29.256; 257/E29.258; 257/E29.268
(58) Field of Classification Search .......... 257/328–346, 257/371, E27.064, E29.04, 189, 122, 126, 257/401–409, E21.427, E29.062, E29.064, 257/256–258, 268
See application file for complete search history.

(56) References Cited

U.S. PATENT DOCUMENTS

| | | | | |
|---|---|---|---|---|
| 5,041,895 A | * | 8/1991 | Contiero et al. | 257/370 |
| 5,286,995 A | * | 2/1994 | Malhi | 257/549 |
| 5,382,536 A | * | 1/1995 | Malhi et al. | 438/283 |
| 5,514,608 A | * | 5/1996 | Williams et al. | 438/286 |
| 5,852,314 A | * | 12/1998 | Depetro et al. | 257/343 |
| 5,912,490 A | * | 6/1999 | Hebert et al. | 257/340 |
| 6,093,588 A | * | 7/2000 | De Petro et al. | 438/180 |
| 6,169,309 B1 | * | 1/2001 | Teggatz et al. | 257/328 |
| 6,566,710 B1 | * | 5/2003 | Strachan et al. | 257/341 |
| 6,635,925 B1 | * | 10/2003 | Taniguchi et al. | 257/335 |
| 6,717,230 B2 | * | 4/2004 | Kocon | 257/487 |
| 6,864,537 B1 | * | 3/2005 | Mallikarjunaswamy | 257/355 |
| 6,870,218 B2 | * | 3/2005 | Cai | 257/335 |
| 6,897,525 B1 | * | 5/2005 | Kikuchi et al. | 257/343 |
| 6,903,421 B1 | * | 6/2005 | Huang et al. | 257/356 |
| 6,911,694 B2 | * | 6/2005 | Negoro et al. | 257/336 |
| 6,924,531 B2 | * | 8/2005 | Chen et al. | 257/336 |
| 7,220,646 B2 | * | 5/2007 | Cai | 438/286 |
| 7,345,340 B2 | * | 3/2008 | Hitani et al. | 257/335 |
| 7,485,924 B2 | * | 2/2009 | Takimoto et al. | 257/339 |
| 7,575,977 B2 | * | 8/2009 | Levin et al. | 438/286 |
| 7,618,854 B2 | * | 11/2009 | Lee | 438/197 |
| 7,655,980 B1 | * | 2/2010 | Chao et al. | 257/335 |
| 7,683,427 B2 | * | 3/2010 | Chen et al. | 257/343 |
| 7,732,863 B2 | * | 6/2010 | Pendharkar et al. | 257/343 |
| 7,750,401 B2 | * | 7/2010 | Cai | 257/335 |
| 2007/0120190 A1 | | 5/2007 | Schwantes et al. | |
| 2007/0278568 A1 | * | 12/2007 | Williams et al. | 257/335 |

* cited by examiner

*Primary Examiner* — Michael S Lebentritt
(74) *Attorney, Agent, or Firm* — WPAT, PC; Justin King

(57) ABSTRACT

A LDMOS device for an ESD protection circuit is provided. The LDMOS device includes a substrate of a first conductivity type, a deep well region of a second conductivity type, a body region of the first conductivity type, first and second doped regions of the second conductivity type, and a gate electrode. The deep well region is disposed in the substrate. The body region and the first doped region are respectively disposed in the deep well region. The second doped region is disposed in the body region. The gate electrode is disposed on the deep well region between the first and second doped regions. It is noted that the body region does not include a doped region of the first conductivity type having a different doped concentration from the body region.

16 Claims, 2 Drawing Sheets

US 7,906,810 B2

LDMOS DEVICE FOR ESD PROTECTION CIRCUIT

BACKGROUND OF THE INVENTION

1. Field of Invention

The present invention relates to a semiconductor device, and more particularly to a lateral double diffused metal oxide semiconductor (LDMOS) device for an electrostatic discharge (ESD) protection circuit.

2. Description of Related Art

ESD is a phenomenon of electrostatic motion along a non-conductive surface. Semiconductor devices and circuits in ICs can be damaged by ESD. For example, a charge carrying object, such as a human body walking on a carpet, a machine for packaging ICs or an apparatus for testing ICs, can discharge to the IC chip when they are in contact with each other. Thus, the IC chip is damaged or broken by the transient power of ESD.

Therefore, a number of methods have been developed to protect semiconductor integrated circuit devices against possible ESD damages. The most common type of ESD protection is the incorporation of a special hardware inside the package. In other words, a specially designed ESD protection circuit is set up between an internal device and each bonding pad, so as to protect the internal device.

Currently, a lateral double diffused N-type metal oxide semiconductor (LDNMOS) device is an electronic device widely applied in the power management. When the internal device is a high voltage device such as a large-sized output driver, the output driver is coupled to a control circuit, and a gate-grounded LDNMOS device is used as an ESD protection device. However, the gate electrode of the output driver is floating under the ESD transient condition, so that the trigger voltage of the output driver is equal to, or even less than, that of the ESD protection device (i.e. gate-grounded LDNMOS device). Thus, the output driver might be turned on more quickly than the LDNMOS device for an ESD protection circuit (ESD LDNMOS device); hence, the ESD LDNMOS device is useless in protecting the output driver.

Accordingly, it has become one of the main topics in the industry to design an ESD LDNMOS device which can be turned on more quickly than the internal device.

SUMMARY OF THE INVENTION

The present invention provides a LDNMOS device for an ESD protection circuit. The ESD LDNMOS device can be turned on more quickly than the internal device to be protected.

The present invention provides a LDMOS device for an ESD protection circuit. The LDMOS device includes a substrate of a first conductivity type, a deep well region of a second conductivity type, a body region of the first conductivity type, a first doped region of the second conductivity type, a second doped region of the second conductivity type, and a gate electrode. The deep well region is disposed in the substrate. The body region is disposed in the deep well region. The first doped region is disposed in the deep well region. The second doped region is disposed in the body region. The gate electrode is disposed on the deep well region between the first and second doped regions. It is noted that the body region does not include a doped region of the first conductivity type having a different doped concentration from the body region.

According to an embodiment of the present invention, the LDMOS device for an ESD protection circuit further includes an isolation structure and a drift region of the second conductivity type. The isolation structure is disposed between the gate electrode and the first doped region. The drift region surrounds at least a portion of the isolation structure and connects to the first doped region.

According to an embodiment of the present invention, the isolation structure includes a field oxide (FOX) structure or a shallow trench isolation (STI) structure.

According to an embodiment of the present invention, the LDMOS device for an ESD protection circuit further includes a contact connecting to the body region and the second doped region in the body region.

According to an embodiment of the present invention, the contact is coupled to a source voltage source and the first doped region is coupled to a drain voltage source.

According to an embodiment of the present invention, a junction between the contact and the body region is a Shottky contact.

According to an embodiment of the present invention, the first conductivity type is P-type and the second conductivity is N-type.

According to an embodiment of the present invention, the first conductivity type is N-type and the second conductivity is P-type.

According to an embodiment of the present invention, the LDMOS device for an ESD protection circuit further includes a well region of the first conductivity type and a third doped region of the first conductivity type. The well region is disposed outside the deep well region. The third doped region functioning as a guard ring is disposed in the well region, and the third doped region is grounded.

The present invention also provides a LDMOS device for an ESD protection circuit. The LDMOS device includes a substrate of a first conductivity type, a deep well region of a second conductivity type, a body region of the first conductivity type, a first doped region of the second conductivity type, a second doped region of the second conductivity type, a gate electrode and a contact. The deep well region is disposed in the substrate. The body region is disposed in the deep well region. The first doped region is disposed in the well region. The second doped region is disposed in the body region. The gate electrode is disposed on the deep well region between the first and second doped regions. The contact only connects to the body region and the second doped region in the body region.

According to an embodiment of the present invention, the LDMOS device for an ESD protection circuit further includes an isolation structure and a drift region of the second conductivity type. The isolation structure is disposed between the gate electrode and the first doped region. The drift region surrounds at least a portion of the isolation structure and connects to the first doped region.

According to an embodiment of the present invention, the isolation structure includes a FOX structure or a STI structure.

According to an embodiment of the present invention, the contact is coupled to a source voltage source and the first doped region is coupled to a drain voltage source.

According to an embodiment of the present invention, a junction between the contact and the body region is a Shottky contact.

According to an embodiment of the present invention, the first conductivity type is P-type and the second conductivity is N-type.

According to an embodiment of the present invention, the first conductivity type is N-type and the second conductivity is P-type.

According to an embodiment of the present invention, the LDMOS device for an ESD protection circuit further includes a well region of the first conductivity type and a third doped region of the first conductivity type. The well region is disposed outside the deep well region. The third doped region functioning as a guard ring is disposed in the well region, and the third doped region is grounded.

Compared to the conventional ESD LDMOS device, the ESD LDMOS device of the present invention has a higher resistance, so that the trigger voltage is lower, and the ESD LDMOS device can be turned on more quickly to protect the internal device.

In order to make the aforementioned and other objects, features and advantages of the present invention comprehensible, a preferred embodiment accompanied with figures is described in detail below.

DESCRIPTION OF EMBODIMENTS

Figure 1:
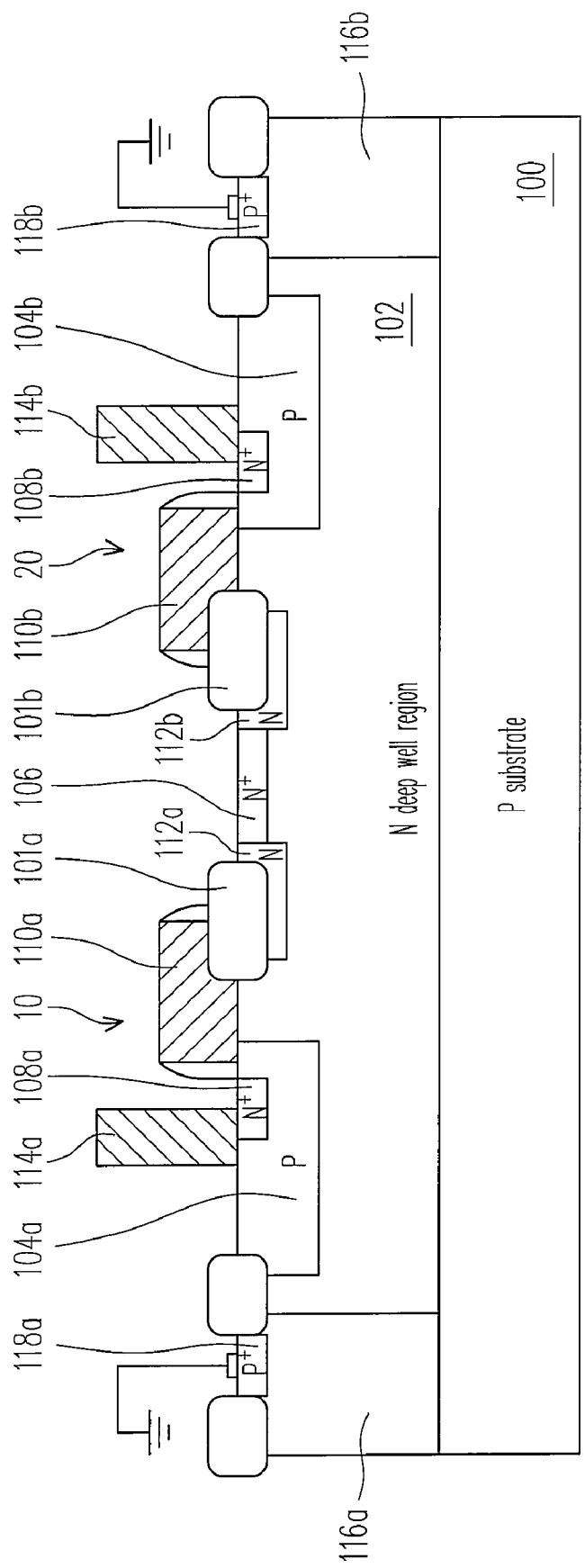
FIG. 1 schematically illustrates a cross-section view of a LDMOS device for an ESD protection circuit according to an embodiment of the present invention.

FIG. 1 schematically illustrates a cross-section view of a LDMOS device for an ESD protection circuit according to an embodiment of the present invention.

The following embodiment in which the first conductivity type is P-type and the second conductivity type is N-type is provided for illustration purposes, and is not to construed as limiting the scope of the present invention. It is appreciated by persons skilled in the art that the first conductivity type can be N-type and the second conductivity type can be P-type.

Referring to FIG. 1, the LDMOS devices 10 and 20 for an ESD protection circuit (ESD LDMOS devices 10 and 20) includes a substrate 100 of a first conductivity type, and a deep well region 102 of a second conductivity type. In this embodiment, two ESD LDMOS devices 10 and 20 are provided for illustration purposes and are not to be construed as limiting the scope of the present invention. The number of the ESD LDMOS devices is not limited by the present invention. The substrate 100 may be a P-type substrate. The deep well region 102 is, for example, an N-type deep well region disposed in the substrate 100.

The ESD LDMOS device 10 further includes a gate electrode 110a, a first doped region 106 of the second conductivity type, a second doped region 108a of the second conductivity type, and a body region 104a of the first conductivity type. The ESD LDNMOS device 20 further includes a gate electrode 110b, a first doped region 106 of the second conductivity type, a second doped region 108b of the second conductivity type, and a body region 104b of the first conductivity type.

The body regions 104a and 104b are, for example, P-type body regions disposed in the deep well region 102. The first doped region 106 is, for example, an N+ doped region disposed in the deep well region 102, and operates as the common drain region for the ESD LDMOS devices 10 and 20.

The second doped regions 108a and 108b are, for example, N+ doped regions, and operate as the source regions respectively for the ESD LDMOS devices 10 and 20. The second doped regions 108a and 108b are disposed respectively in the body regions 104a and 104b.

The gate electrode 110a is disposed on the deep well region 102 between the first doped region 106 and the second doped region 108a. The gate electrode 110b is disposed on the deep well region 102 between the first doped region 106 and the second doped region 108b. In an embodiment, the gate electrodes 110a and 110b are electronically coupled to each other.

It is noted that the body regions 104a and 104b do not include a doped region of the first conductivity type having a different doped concentration from the body regions 104a and 104b. In an embodiment, when the body regions 104a and 104b are, for example, P-type doped regions, no P+ doped region is present in the body regions 104a and 104b, but N-type doped regions such as the second doped regions 108a and 108b are allowed to be present.

In an embodiment, the ESD LDMOS devices 10 and 20 further respectively include isolation structures 101a and 101b, and the drift regions 112a and 112b of the second conductivity type. The isolation structures 101a and 101b may be field oxide (FOX) structures or shallow trench isolation (STI) structures. The isolation structure 101a is disposed between the gate electrode 110b and the first doped region 106. The isolation structure 101b is disposed between the gate electrode 110b and the first doped region 106. The drift regions 112a and 112b are, for example, N-type drift regions respectively surrounding at least a portion of the isolation structures 101a and 101b and connecting to the first doped region 106.

Further, the ESD LDMOS devices 10 and 20 also respectively include contacts 114a and 114b. The contact 114a connects to the body region 104a and the second doped region 108a in the body region 104a. The contact 114b connects to the body region 104b and the second doped region 108b in the body region 104b. The contacts 114a and 114b are coupled to a source voltage source, and the first doped region 106 is coupled to a drain voltage source.

The body regions 104a and 104b do not include a doped region of the first conductivity type having a different concentration from the body regions 104a and 104b, such as a P+ doped region; in other words, the contacts 114a and 114b do not connect to any P+ doped region. The doped concentration of the body regions 104a and 104b is not high, so that the junction between the contact 114a and the body region 104a as well as the junction between the contact 114b and the body region 104b are respectively a Shottky contact with a higher junction resistance. On the other side, the doped concentration of the second regions 108a and 108b is high enough, so that the junction between the contact 114a and the second doped region 108a as well as the junction between the contact 114b and the second doped region 108b are respectively an Ohmic contact with a lower junction resistance.

The ESD LDMOS devices 10 and 20 of the present invention can also include well regions 116a and 116b of the first conductivity type and third doped regions 118a and 118b of the first conductivity type. The well regions 116a and 116b are respectively disposed outside the deep well region 102. The third doped regions 118a and 118b functioning as a guard ring are respectively disposed in the well regions 116a and 116b, and the third doped regions 118a and 118b are grounded.

In the ESD LDMOS device 10, the body region 104a, the deep well region 102 and the substrate 100 form a pnp parasitic bipolar junction transistor (BJT) coupled to the source voltage source via the body region 104a. The body region 104a has a higher resistance due to the lower dopant concentration thereof, and the Shottky contact between the contact 114a and the body region 104a also has a higher junction resistance; thus, when the same pulse current passes, the parasitic BJT can be triggered to turn on more quickly because V=I×R. Therefore, the trigger voltage of the ESD LDMOS device 10 is reduced, so that the ESD LDMOS device 10 can be turned on more quickly than the conventional ESD LDMOS device, and the purpose of protecting the internal device is achieved. The ESD LDMOS device 20 is similar to the ESD LDMOS device 10, and the details are not iterated.

Figure 2:
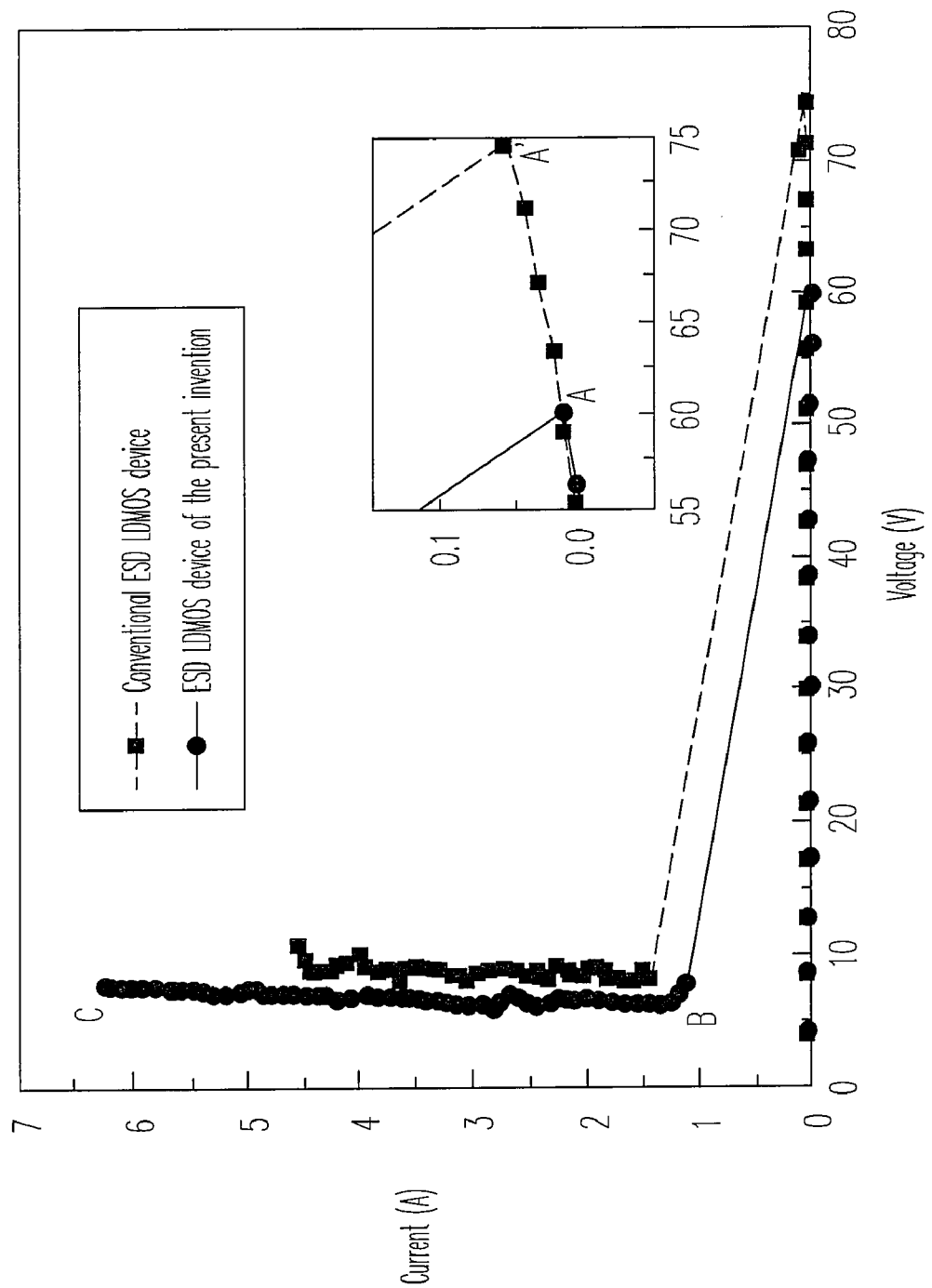
FIG. 2 illustrates an I-V diagram of the ESD LDMOS device of the present invention and the conventional ESD LDMOS device, which are measured by a transmission line pulsing system (TLP system).

The ESD LDMOS device of the present invention is compared to the conventional ESD LDMOS device to prove the performance of the present invention. FIG. 2 illustrates an I-V diagram of the ESD LDMOS device in FIG. 1 and the conventional ESD LDMOS device, which are measured by a transmission line pulsing system (TLP system). The conventional ESD LDMOS device (dotted line) and the ESD LDMOS device of the present invention (solid line) are respectively a same-dimensioned 40V LDNMOS device for an ESD protection circuit.

The ESD LDMOS device 10 is exemplified to illustrate the mechanism of the ESD protection circuit of the present invention. In the ESD LDMOS device 10, when the pulse current is increased to reach a ESD zapping condition, since the junction between the body region 104a (base) and the contact 114a is a Shottky contact with a higher resistance, the parasitic bipolar junction transistor (BJT) including the second doped region 108a, the body region 104a and the deep well region 102 can be turned on more quickly, so that the trigger voltage of the ESD LDMOS device 10 is lower than the conventional ESD LDMOS device. As shown in FIG. 2, the trigger voltage (point A; 60V) of the ESD LDMOS device 10 of the present invention is lower than that (point A'; 75V) of the conventional ESD LDMOS device. Thereafter, the ESD LDMOS device 10 of the present invention is turned on, and the operation returns to a snapback region (between point B and point C) of the I-V curve and fails at point C.

The trigger voltage of the conventional ESD LDMOS device is about 75V and the trigger current is about 55 mA, while the trigger voltage of the ESD LDMOS device of the present invention is about 60V and the trigger current is about 14 mA. The result proves that the ESD LDMOS device of the present invention in which no heavily doped region of the same conductivity type is formed in the body region can be turned on more quickly than the conventional ESD LDMOS device, so as to achieve the purpose of protecting the internal device.

Further, the ESD LDMOS device of the present invention has a lower holding voltage and a higher second breakdown current than the conventional ESD LDMOS device, so that the ESD protection ability is enhanced.

In summary, without heavily doped region of the same conductivity type in the body region, the ESD LDMOS device of the present invention forms a Shottky contact between the body region and the contact, so that the contact resistance thereof is higher than that of the conventional ESD LDMOS device; hence, the trigger voltage can be significantly reduced, and the ESD LDMOS device of the present invention can be turned on more quickly to protect the internal device. Further, the ESD LDMOS device of the present invention can be applicable to all power management ICs. The process is simple without additional mask or process, so that the cost is significantly reduced and the competitiveness is greatly enhanced.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A LDMOS device for an ESD protection circuit, comprising:
    a substrate of a first conductivity type;
    a deep well region of a second conductivity type, disposed in the substrate;
    a body region of the first conductivity type, disposed in the deep well region,
    a first doped region of the second conductivity type, disposed in the deep well region;
    a second doped region of the second conductivity type, disposed in the body region;
    a gate electrode, disposed on the deep well region between the first and second doped regions, and
    a contact, connecting to the body region and the second doped region in the body region;
    wherein the body region does not comprise a doped region of the first conductivity type having a different doped concentration from the body region.

2. The device of claim 1, further comprising:
    an isolation structure, disposed between the gate electrode and the first doped region; and
    a drift region of the second conductivity type, surrounding at least a portion of the isolation structure and connecting to the first doped region.

3. The device of claim 2, wherein the isolation structure comprises a FOX structure or a STI structure.

4. The device of claim 1, wherein the contact is coupled to a source voltage source and the first doped region is coupled to a drain voltage source.

5. The device of claim 1, wherein a junction between the contact and the body region is a Shottky contact.

6. The device of claim 1, wherein the first conductivity type is P-type and the second conductivity is N-type.

7. The device of claim 1, wherein the first conductivity type is N-type and the second conductivity is P-type.

8. The device of claim 1, further comprising:
    a well region of the first conductivity type, disposed outside the deep well region; and
    a third doped region of the first conductivity type, functioning as a guard ring and disposed in the well region, wherein the third doped region is grounded.

9. A LDMOS device for an ESD protection circuit, comprising:
    a substrate of a first conductivity type;
    a deep well region of a second conductivity type, disposed in the substrate;
    a body region of the first conductivity type, disposed in the deep well region;
    a first doped region of the second conductivity type, disposed in the well region;
    a second doped region of the second conductivity type, disposed in the body region;
    a gate electrode, disposed on the deep well region between the first and second doped regions; and
    a contact, only connecting to the body region and the second doped region in the body region.

10. The device of claim 9, further comprising:
    an isolation structure, disposed between the gate electrode and the first doped region; and
    a drift region of the second conductivity type, surrounding at least a portion of the isolation structure and connecting to the first doped region.

11. The device of claim 10, wherein the isolation structure comprises a FOX structure or a STI structure.

12. The device of claim 9, wherein the contact is coupled to a source voltage source and the first doped region is coupled to a drain voltage source.

13. The device of claim 9, wherein a junction between the contact and the body region is a Shottky contact.

14. The device of claim 9, wherein the first conductivity type is P-type and the second conductivity is N-type.

15. The device of claim 9, wherein the first conductivity type is N-type and the second conductivity is P-type.

16. The device of claim 9, further comprising:
 a well region of the first conductivity type, disposed outside the deep well region; and
 a third doped region of the first conductivity type, functioning as a guard ring and disposed in the well region, wherein the third doped region is grounded.

* * * * *